US006674866B2

(12) United States Patent
Su

(10) Patent No.: US 6,674,866 B2
(45) Date of Patent: Jan. 6, 2004

(54) AUDIO REPRODUCTION APPARATUS

(76) Inventor: Keng-Kuei Su, 7F-2, No. 286-8, Hsin-Ya Rd., Chien-Chen Dist., Kaohsiung City (TW)

( * ) Notice: Subject to any disclaimer, the term of this patent is extended or adjusted under 35 U.S.C. 154(b) by 165 days.

(21) Appl. No.: 09/870,733

(22) Filed: Jun. 1, 2001

(65) Prior Publication Data

US 2002/0181716 A1 Dec. 5, 2002

(51) Int. Cl.[7] .............................................. H03F 21/00
(52) U.S. Cl. ........................... 381/120; 381/77; 381/99
(58) Field of Search ............................ 381/77, 80, 85, 381/120, 99; 330/195, 196, 197, 185, 186, 188, 190

(56) References Cited

U.S. PATENT DOCUMENTS 5,530,770 A * 6/1996 Kim ........................... 381/120
5,814,752 A * 9/1998 Rivera ........................ 381/120

* cited by examiner

*Primary Examiner*—Minsun Oh Harvey
(74) *Attorney, Agent, or Firm*—Foley & Lardner

(57) ABSTRACT

An audio reproduction apparatus includes a primary audio amplifier having an output side for outputting audio signals, and a plurality of auxiliary audio amplifiers coupled electrically in series to the primary audio amplifier. Each of the auxiliary audio amplifiers has an input side for receiving the audio signals from the primary audio amplifier, a signal current generating device coupled electrically across the input side such that the audio signals pass through the signal current generating device, a current inducing device disposed adjacent to the signal current generating device for generating induced audio signals when the audio signals pass through the signal current generating device, an auxiliary amplifier coupled electrically to the current inducing device for amplifying and outputting the induced audio signals generated thereby, and a loudspeaker coupled electrically to the auxiliary amplifier for reproducing the induced audio signals amplified by the auxiliary amplifier.

3 Claims, 4 Drawing Sheets

AUDIO REPRODUCTION APPARATUS

BACKGROUND OF THE INVENTION

1. Field of the Invention

The invention relates to an audio reproduction apparatus, more particularly to an audio reproduction apparatus that can ensure a stable audio signal transmission, and that can provide a wide audio reproduction area, and that has a relatively low cost.

2. Description of the Related Art

FIG. 1 illustrates a conventional audio reproduction apparatus that includes an audio amplifier 111 having an output side 110 for outputting audio signals and an output voltage, and an impedance matching network 13 coupled electrically across the input side 110. The audio amplifier 11 includes an amplifier 111, and a transformer 112 coupled electrically to the amplifier 111 for increasing the output voltage from the audio amplifier 11. The impedance matching network 13 includes a plurality of loudspeakers 131 that are coupled electrically in series or parallel to each other.

The following are some of the drawbacks of the conventional audio reproduction apparatus:

1. For optimum power transmission, an output impedance across the output side 110 should be equal to a total impedance of the impedance matching network 13, thereby resulting in a complex impedance design for the impedance matching network 13. Furthermore, since the impedance matching network 13 has so many impedance components, attenuation of frequency response of audio frequency occurs, thereby resulting in poor audio reproduction quality.

2. When the number of the loudspeakers 131 in the impedance matching network 13 is increased, the output impedance may not match the total impedance of the impedance matching network 13, thereby resulting in a limited number of the loudspeakers 131 that can be incorporated in the impedance matching network 13.

3. When it is necessary to increase the number of the loudspeakers 131 in the impedance matching network 13, another audio amplifier, which can provide higher output power, must be installed to replace the audio amplifier 11, thereby resulting in higher costs.

SUMMARY OF THE INVENTION

Therefore, the object of the present invention is to provide an audio reproduction apparatus that can overcome the drawbacks associated with the aforesaid prior art.

According to the present invention, an audio reproduction apparatus comprises:

a primary audio amplifier having an output side for outputting audio signals; and a plurality of auxiliary audio amplifiers coupled electrically in series to the primary audio amplifier, each of the auxiliary audio amplifiers having an input side for receiving the audio signals from the primary audio amplifier, a signal current generating device coupled electrically across the input side such that the audio signals pass through the signal current generating device, a current inducing device disposed adjacent to the signal current generating device for generating induced audio signals when the audio signals pass through the signal current generating device, an auxiliary amplifier coupled electrically to the current inducing device for amplifying and outputting the induced audio signals generated thereby, and a loudspeaker coupled electrically to the auxiliary amplifier for reproducing the induced audio signals amplified by the auxiliary amplifier.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
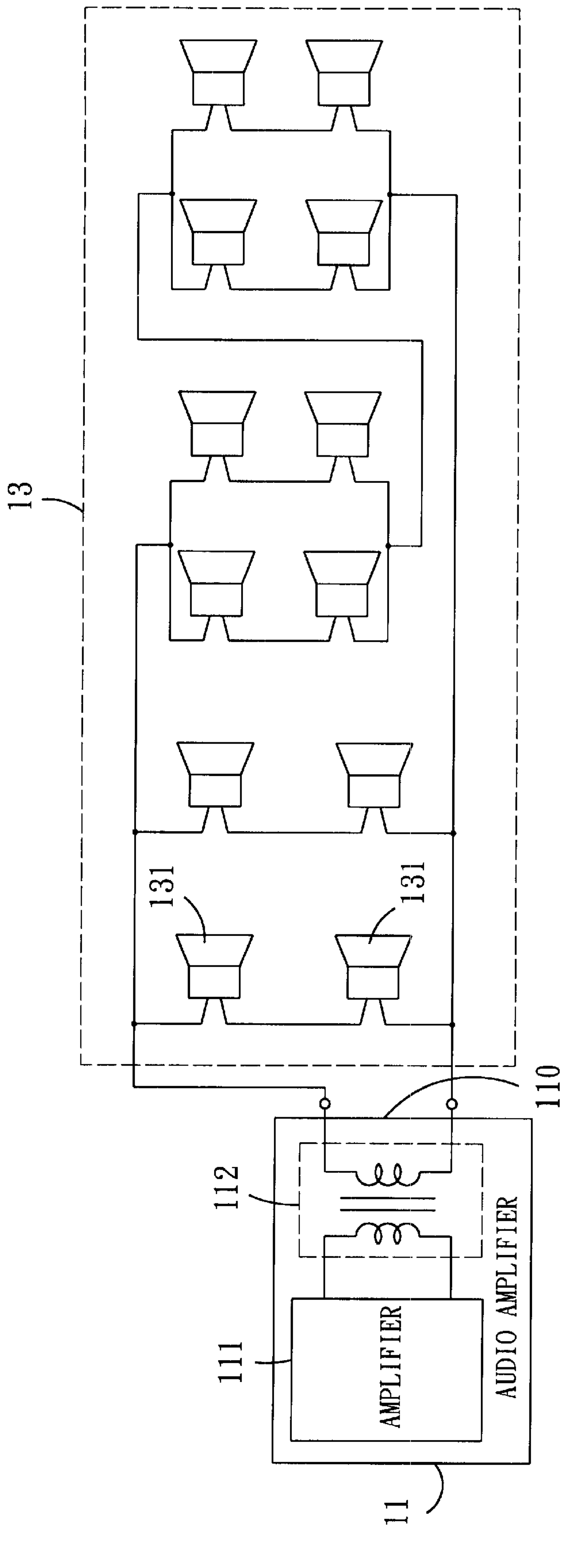
FIG. 1 PRIOR ART
FIG. 1 is a schematic electrical circuit diagram of a conventional audio reproduction apparatus.
Figure 2:
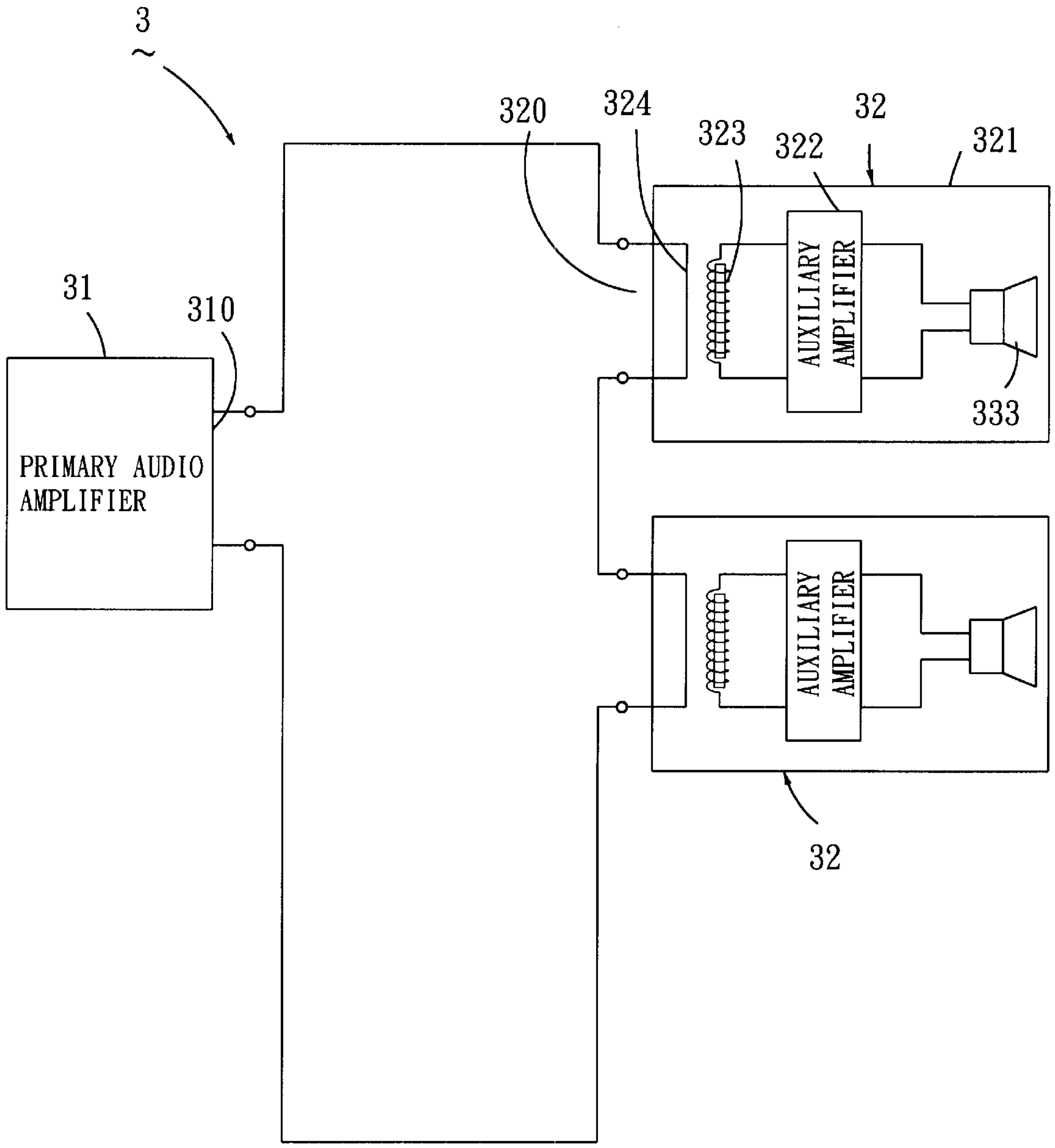
FIG. 2 is a fragmentary schematic electrical circuit diagram of the first preferred embodiment of an audio reproduction apparatus according to this invention.

Referring to FIG. 2, according to the first preferred embodiment of this invention, an audio reproduction apparatus 3 is shown to include a primary audio amplifier 31, and a plurality of auxiliary audio amplifiers 32.

The primary audio amplifier 31 has an output side 310 for outputting audio signals.

The auxiliary audio amplifiers 32 are coupled electrically in series to the primary audio amplifier 31. Each of the auxiliary audio amplifiers 32 has an input side 320, a signal current generating device 324, a current inducing device, an auxiliary amplifier 322, a loudspeaker 333 and a housing 321. The input side 320 receives the audio signals from the primary audio amplifier 31. The signal current generating device 324, such as a conductive wire, is coupled electrically across the input side 320 such that the audio signals pass through the signal current generating device 324. The current inducing device is disposed adjacent to the signal current generating device 324 for generating induced audio signals when the audio signals pass through the signal current generating device 324. In this embodiment, the current inducing device includes a coiled core 323 that is elongated and that is disposed parallel to the signal current generating device 324. The auxiliary amplifier 322 is coupled electrically to the current inducing device for amplifying and outputting the induced audio signals generated thereby. The loudspeaker 333 is coupled electrically to the auxiliary amplifier 322 for reproducing the induced audio signals amplified by the auxiliary amplifier 322. The housing 321 receives the signal current generating device 324, the current inducing device, the auxiliary amplifier 322 and the loudspeaker 333 therein.

Figure 3:
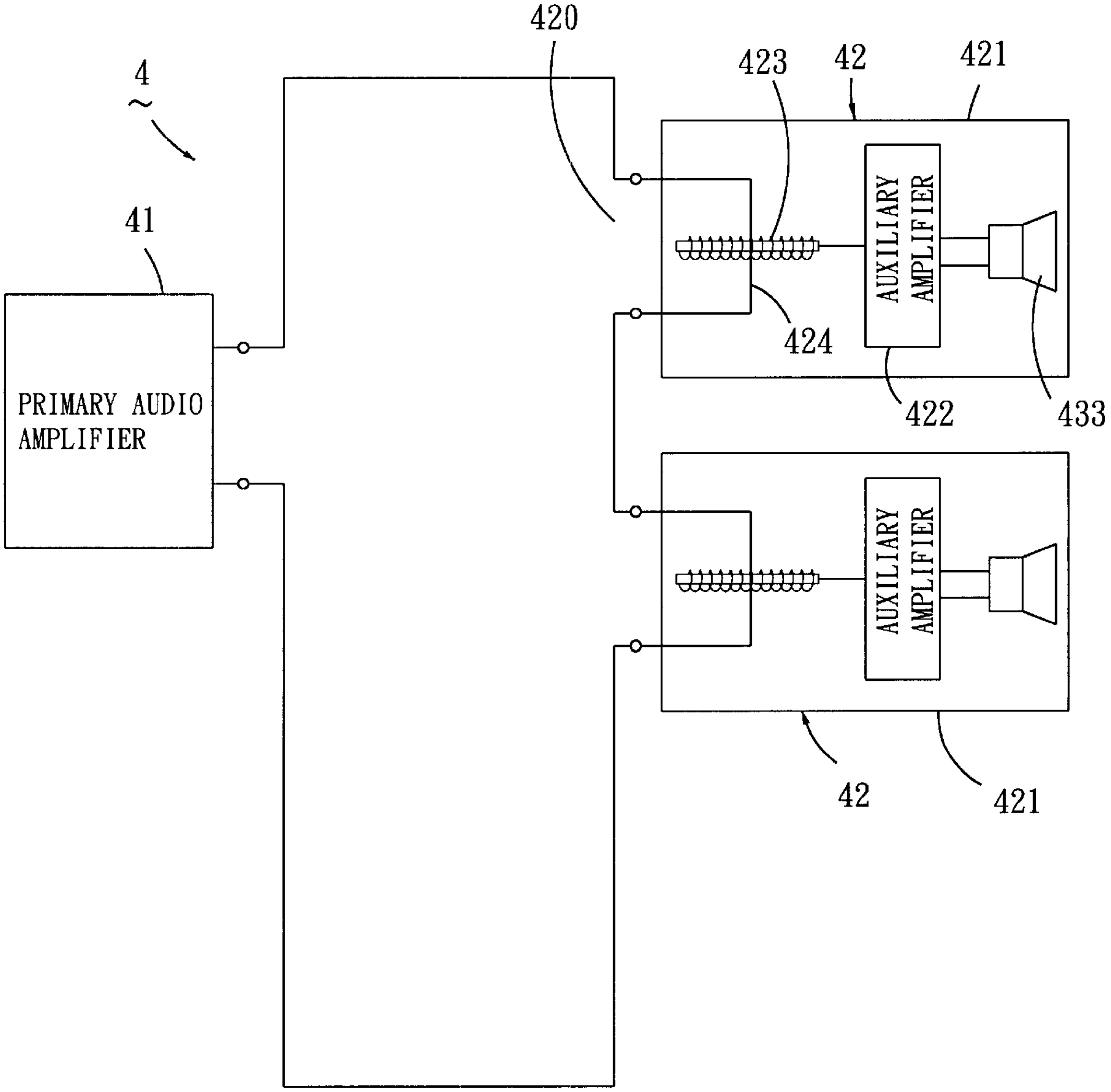
FIG. 3 is a fragmentary schematic electrical circuit diagram of the second preferred embodiment of an audio reproduction apparatus according to this invention.
Figure 4:
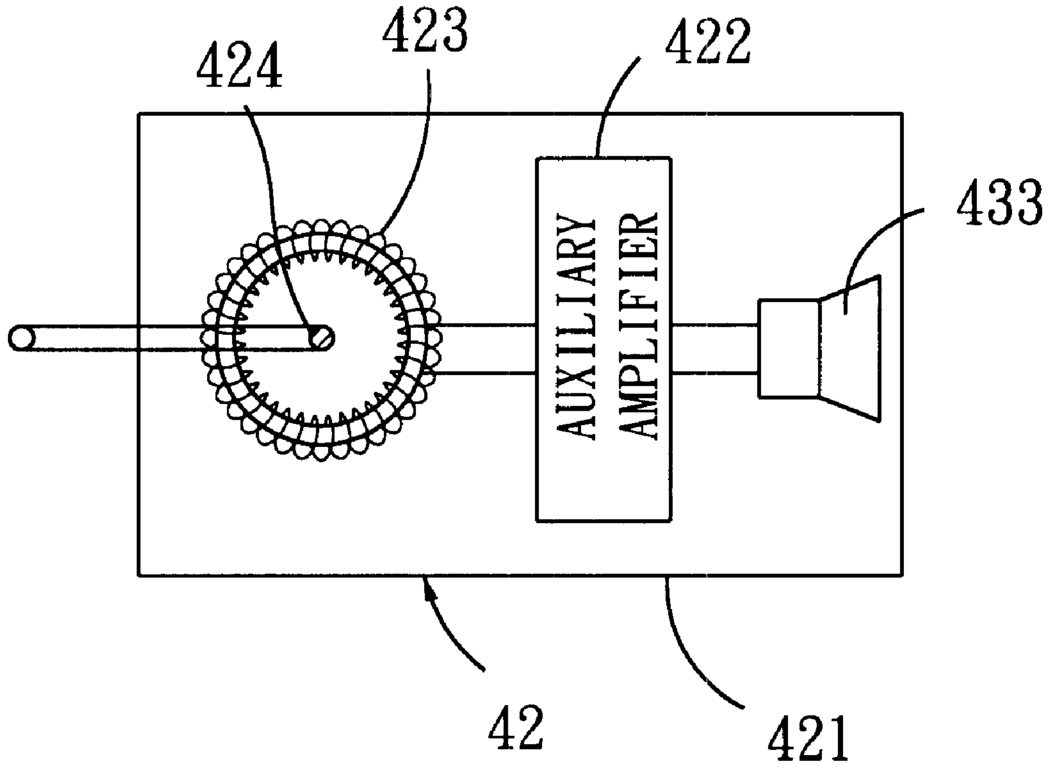
FIG. 4 is a schematic electrical circuit diagram of an auxiliary audio amplifier of the second preferred embodiment.

FIGS. 3 and 4 illustrate the second preferred embodiment of an audio reproduction apparatus 4 according to the present invention, which is a modification of the first preferred embodiment. The second preferred embodiment includes a primary audio amplifier 41 and a plurality of auxiliary audio amplifiers 42 coupled electrically in series to the primary audio amplifier 41. Each auxiliary audio amplifier 42 includes an input side 420, a signal current generating device 424, a current inducing device in the form of a coiled core 423, an auxiliary amplifier 422, a loudspeaker 433 and a housing 421. Unlike the previous embodiment, the coiled core 423 is annular and defines a plane with a center. The signal current generating device 424 extends through the center and is perpendicular to the plane.

The following are some of the advantages of the present invention:

1. Since the audio signals outputted by the primary audio amplifier only pass through the signal current generating device of each of the auxiliary audio amplifiers, distortion of the audio signals can be minimized, thereby resulting in a stable audio signal transmission.

2. Since the audio reproduction apparatus of this invention utilizes the current inducing device of each of the auxiliary audio amplifiers to generate the induced audio signals associated with the audio signals from the primary audio amplifier, the number of auxiliary audio amplifiers can be varied according to a user's requirement such that the audio reproduction apparatus of this invention can provide a wide audio reproduction area.

3. Regardless of how many auxiliary audio amplifiers are used in the audio reproduction apparatus of this invention, impedance matching problem between the output side of the primary audio amplifier and the input side of each of the auxiliary audio amplifiers is eliminated such that replacement of the primary audio amplifier is not required when the number of auxiliary audio amplifiers that are in use is increased, thereby resulting in lower costs.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

I claim:

1. An audio reproduction apparatus comprising:

a primary audio amplifier having an output side for outputting audio signals; and a plurality of auxiliary audio amplifiers coupled electrically in series to said primary audio amplifier, each of said auxiliary audio amplifiers having an input side for receiving the audio signals from said primary audio amplifier, a signal current generating device coupled electrically across said input side such that the audio signals pass through said signal current generating device, a current inducing device disposed adjacent to said signal current generating device for generating induced audio signals when the audio signals pass through said signal current generating device, an auxiliary amplifier coupled electrically to said current inducing device for amplifying and outputting the induced audio signals generated thereby, and a loudspeaker coupled electrically to said auxiliary amplifier for reproducing the induced audio signals amplified by said auxiliary amplifier, wherein said current inducing device includes a coiled core, and wherein said coiled core is elongated and is disposed parallel to said signal current generating device.

2. The audio reproduction apparatus of claim 1, wherein each of said auxiliary audio amplifiers further has a housing for receiving said signal current generating device, said current inducing device, said auxiliary amplifier and said loudspeaker therein.

3. An audio reproduction apparatus comprising:

a primary audio amplifier having an output side for outputting audio signals; and a plurality of auxiliary audio amplifiers coupled electrically in series to said primary audio amplifier, each of said auxiliary audio amplifiers having an input side for receiving the audio signals from said primary audio amplifier, a signal current generating device coupled electrically across said input side such that the audio signals pass through said signal current generating device, a current inducing device disposed adjacent to said signal current generating device for generating induced audio signals when the audio signals pass through said signal current generating device, an auxiliary amplifier coupled electrically to said current inducing device for amplifying and outputting the induced audio signals generated thereby, and a loudspeaker coupled electrically to said auxiliary amplifier for reproducing the induced audio signals amplified by said auxiliary amplifier, wherein said current inducing device includes a coiled core, and wherein said coiled core is annular and defines a plane with a center, said signal current generating device extending through the center and being perpendicular to the plane.

* * * * *